United States Patent
Behrendt et al.

(10) Patent No.: US 11,486,935 B2
(45) Date of Patent: Nov. 1, 2022

(54) METHOD AND MANAGEMENT SYSTEM FOR CONTROLLING AND MONITORING A PLURALITY OF BATTERY CELLS IN A BATTERY PACK, AND BATTERY PACK

(71) Applicant: Robert Bosch GmbH, Stuttgart (DE)

(72) Inventors: Hendrik Behrendt, Stuttgart (DE); Mykola Raievskyi, Beilstein (DE)

(73) Assignee: Robert Bosch GmbH, Stuttgart (DE)

( * ) Notice: Subject to any disclaimer, the term of this patent is extended or adjusted under 35 U.S.C. 154(b) by 149 days.

(21) Appl. No.: 16/960,570

(22) PCT Filed: Dec. 28, 2018

(86) PCT No.: PCT/EP2018/097110
§ 371 (c)(1),
(2) Date: Jul. 8, 2020

(87) PCT Pub. No.: WO2019/134891
PCT Pub. Date: Jul. 11, 2019

(65) Prior Publication Data
US 2020/0386824 A1    Dec. 10, 2020

(30) Foreign Application Priority Data
Jan. 8, 2018  (DE) ...................... 10 2018 200 144.8

(51) Int. Cl.
*G01R 31/3842* (2019.01)
*G01R 31/367* (2019.01)
(Continued)

(52) U.S. Cl.
CPC ........ *G01R 31/3842* (2019.01); *B60L 3/0046* (2013.01); *B60L 3/12* (2013.01);
(Continued)

(58) Field of Classification Search
CPC .............. G01R 31/3842; G01R 31/367; G01R 31/006; G01R 31/374; G01R 31/382;
(Continued)

(56) References Cited

U.S. PATENT DOCUMENTS 8,872,481 B2   10/2014   Chawla et al.
2007/0145954 A1   6/2007   Kawahara et al.
(Continued)

FOREIGN PATENT DOCUMENTS

DE   102014204103 A   9/2014
JP   2013041448 A   2/2013
(Continued)

OTHER PUBLICATIONS

International Search Report for Application No. PCT/EP2018/097110 dated Mar. 19, 2019 (English Translation, 2 pages).

*Primary Examiner* — Tung S Lau
(74) *Attorney, Agent, or Firm* — Michael Best & Friedrich LLP

(57) ABSTRACT

The invention relates to a method for controlling and monitoring a plurality of battery cells (2) in a battery pack (5), wherein: by means of at least one recording unit (20), a dataset of state variables from each battery cell (2) is recorded and transferred to a selection unit (32); by means of the selection unit (32), individual state variables from the plurality of state variable datasets are selected, which form a virtual dataset of state variables; by means of a simulation unit (34), a model of a virtual cell (8) is created from the selected state variables; and by means of a data-processing unit (36), a limit value for a charging current (I) for charging the battery cells (2) in the battery pack (5) is calculated from the selected state variables of the virtual cell (8).

11 Claims, 3 Drawing Sheets

(51) Int. Cl.
 *B60L 58/15* (2019.01)
 *B60L 58/16* (2019.01)
 *B60L 58/21* (2019.01)
 *B60L 58/14* (2019.01)
 *B60L 3/00* (2019.01)
 *B60L 3/12* (2006.01)

(52) U.S. Cl.
 CPC ............... *B60L 58/14* (2019.02); *B60L 58/15* (2019.02); *B60L 58/16* (2019.02); *B60L 58/21* (2019.02); *G01R 31/367* (2019.01); *B60L 2240/545* (2013.01); *B60L 2240/547* (2013.01); *B60L 2240/549* (2013.01)

(58) Field of Classification Search
 CPC ....... G01R 31/396; B60L 3/0046; B60L 3/12; B60L 58/14; B60L 58/15; B60L 58/16; B60L 58/21; B60L 2240/545; B60L 2240/547; B60L 2240/549; B60L 58/12; B60L 2260/44; B60L 58/18; H02J 7/0047; H02J 7/0048; H02J 7/00304; H02J 7/007; Y02T 10/70; B60Y 2200/91; B60Y 2200/92
 See application file for complete search history.

(56) References Cited

U.S. PATENT DOCUMENTS

| | | |
|---|---|---|
| 2012/0187913 A1 | 7/2012 | Abe et al. |
| 2012/0242289 A1 | 9/2012 | Boehm |
| 2013/0154572 A1 | 6/2013 | Ito |
| 2015/0258897 A1 | 9/2015 | Okada et al. |
| 2016/0243956 A1 | 8/2016 | Yuan |

FOREIGN PATENT DOCUMENTS

| | | |
|---|---|---|
| JP | 2013104697 A | 5/2013 |
| WO | 2005050810 A1 | 6/2005 |

METHOD AND MANAGEMENT SYSTEM FOR CONTROLLING AND MONITORING A PLURALITY OF BATTERY CELLS IN A BATTERY PACK, AND BATTERY PACK

BACKGROUND OF THE INVENTION

The invention relates to a method for controlling and monitoring a plurality of battery cells in a battery pack by recording state variables of the battery cells and calculating a threshold value of a charging current for charging the battery cells in the battery pack from the state variables. The invention also relates to a management system for controlling and monitoring a plurality of battery cells in a battery pack. The invention further relates to a battery pack which comprises a management system according to the invention and a plurality of battery cells.

It is becoming apparent that battery systems will be increasingly used in the future, in particular in electric vehicles, which battery systems will have to meet high requirements with respect to reliability, performance, safety and lifespan. In particular, battery systems with lithium-ion battery cells are suitable for such applications. These are distinguished by, amongst other things, high energy densities, thermal stability and an extremely low self-discharge. Lithium-ion battery cells have high requirements with respect to functional safety. If the battery cells are not operated properly, this can give rise to exothermic reactions including fire and/or to degassing.

A battery cell has an anode, which is connected to a negative terminal, and a cathode, which is connected to a positive terminal. A plurality of battery cells of this type are electrically connected to one another, in particular connected to one another in series and are connected to form battery modules or battery packs. A plurality of battery modules or battery packs of this type are connected to one another and thus form the battery system of the electric vehicle. A battery pack comprises a battery management system which monitors operation of the battery cells and controls them in such a way that the battery cells are operated in a safe and sustainable manner with respect to their lifespan.

In order to realize this, the battery management system establishes a current operating state for each battery cell in a battery pack. The operating state can be described by different parameters, for example charge state, aging state, internal resistance, capacity, temperature, voltage, overpotential of the electrodes and lithium concentration in the battery cell. Complex electrochemical model descriptions are used in order to determine the operating state as precisely as possible.

Based on the operating states of the battery cells, characteristics of the battery pack, for example current threshold values for different operating states of the battery cells, are calculated in other functions of the battery management system. The battery management system communicates said characteristics to a central control apparatus of the electric vehicle.

An energy storage system for an electric vehicle is known from US 2013/154572 A1, which energy storage system comprises a plurality of energy storage devices. In this case, a plurality of state information recording devices are provided which record state information, in particular a current, a total voltage, a cell voltage and a temperature. During operation of the energy storage system, a worst value of the recorded state information is in particular taken into account.

A battery system for an electric vehicle is known from US 2015/0258897 A1, which battery system comprises a plurality of battery cells. Recording units are provided which record data, such as a current and a total voltage, for example. Further data, such as a charge state, for example, are calculated. The worst battery cell is then identified using these data.

SUMMARY OF THE INVENTION

A method for controlling and monitoring a plurality of battery cells in a battery pack is proposed. In this case, the battery pack is provided in particular to be used in an electric vehicle. In this case, it can be, amongst other things, a purely electrically powered vehicle, a hybrid vehicle as well as a plug-in hybrid vehicle. However, the battery pack can also be used in consumer electronics products, such as cell phones, tablet PCs, Notebooks or power tools, for example. The battery cells in the battery pack are preferably electrically connected to one another in series.

According to the method according to the invention, at least one recording unit records a respective data set of state variables from each battery cell and transmits it to a selection unit. In this case, a separate recording unit can be associated with each battery cell. A recording unit can also be provided which records data sets of state variables of a plurality of battery cells. A state of the battery cell can be established from the data set of state variables.

The selection unit then selects individual state variables from the plurality of transmitted data sets of state variables. In this case, the selected state variables form a virtual data set of state variables. The selected state variables of the virtual data set can thus come from the data sets of state variables of different battery cells.

A simulation unit then creates a model of a virtual cell from the selected state variables of the virtual data set. The virtual cell thus simulates a battery cell with the virtual data set of state variables created previously. A state of the virtual cells can be established from the virtual data set of state variables.

A data processing unit then calculates a threshold value of a charging current for charging the battery cells in the battery pack from the selected state variables of the virtual data set of the virtual cell. The threshold value of the charging current, thus calculated, is then transmitted to a central control apparatus of the electric vehicle, for example. The central control apparatus can thus limit the charging current in accordance with this threshold value when charging the battery cells in the battery pack.

Depending on the state of the battery cell, an excessive charging current can damage the battery cell. Each of the battery cells may therefore only be charged with a permissible charging current which does not cause any damage to the battery cell. The permissible charging current in each case depends on the state of the battery cell. The worse the state of the battery cell, the lower the permissible charging current. The better the state of the battery cell, the higher the permissible charging current.

The threshold value of the charging current for charging the battery cells in the battery pack is only calculated once according to the invention from the selected state variables of the virtual cell. A separate calculation of permissible charging currents for a plurality of or indeed for all of the battery cells in the battery pack is not required. If the battery cells in the battery pack are electrically connected to one another in series, the same charging current thus always flows through all of the battery cells.

Preferably, the selection unit selects those state variables from the plurality of data sets of state variables which represent a worst possible state of the virtual cell. The state of the virtual cell is thus no better than the state of any battery cell in the battery pack. This ensures that the threshold value of the charging current, thus calculated, is not higher than the permissible charging current of any battery cell in the battery pack. A minimum threshold value of the charging current is thus calculated.

According to an advantageous development of the invention, an energy prediction unit additionally predicts an electrical energy which can be stored in the battery cells in the battery pack from the selected state variables of the virtual data set of the virtual cell. The electrical energy, thus predicted, which can be stored in the battery cells is then transmitted to a central control apparatus of the electric vehicle, for example. The central control apparatus can take into account the predicted electrical energy which can be stored in the battery cells when establishing a range of the electric vehicle, for example.

In this case, the electrical energy which can be stored in one of the battery cells depends on the state of the battery cell. The worse the state of the battery cell, the lower the electrical energy which can be stored in the battery cell. The better the state of the battery cell, the higher the electrical energy which can be stored in the battery cell.

Preferably, the selection unit selects those state variables from the plurality of data sets of state variables which represent a worst possible state of the virtual cell. The state of the virtual cell is thus no better than the state of any battery cell in the battery pack. This ensures that the electrical energy, thus predicted, which can be stored in the battery cells is not higher than an electrical energy which can actually be stored in the battery cells.

According to a further advantageous development of the invention, a power prediction unit additionally predicts a maximum electrical power which can be drawn from the battery cells in the battery pack from the selected state variables of the virtual data set of the virtual cell. The maximum electrical power, thus predicted, which can be drawn from the battery cells is then transmitted to a central control apparatus of the electric vehicle, for example. The central control apparatus can take into account the predicted maximum electrical power which can be drawn from the battery cells, for example, in order to limit a discharge current of the battery pack.

The electrical power which can be drawn from one of the battery cells depends on the state of the battery cell. The worse the state of the battery cell, the lower the electrical power which can be drawn from the battery cell. The better the state of the battery cell, the higher the electrical power which can be drawn from the battery cell.

Preferably, the selection unit selects those state variables from the plurality of data sets of state variables which represent a worst possible state of the virtual cell. The state of the virtual cell is thus no better than the state of any battery cell in the battery pack. This ensures that the electrical power, thus predicted, which can be drawn from the battery cells is not higher than an electrical power which can actually be drawn from the battery cells.

Advantageously, each data set of state variables of a battery cell comprises at least one voltage of the battery cell, one temperature of the battery cell, one overpotential at an anode of the battery cell, one overpotential at a cathode of the battery cell, one charge state at the anode of the battery cell and one charge state at the cathode of the battery cell. The state of the battery cell can be established in a sufficiently precise manner from said state variables.

Advantageously, the virtual data set of state variables of the virtual cell comprises at least one voltage of the battery cell, one temperature of the battery cell, one overpotential at an anode of the battery cell, one overpotential at a cathode of the battery cell, one charge state at the anode of the battery cell and one charge state at the cathode of the battery cell. The state of the battery cell can be established in a sufficiently precise manner from said state variables.

A management system for controlling and monitoring a plurality of battery cells in a battery pack is also proposed. In this case, the management system according to the invention comprises a selection unit for selecting individual state variables from a plurality of data sets of state variables, which are transmitted to the selection unit. The selected state variables form a virtual data set of state variables.

Preferably, a recording unit records a respective data set of state variables from each battery cell in the battery pack and transmits the recorded data sets of state variables to the selection unit of the management system.

The management system according to the invention also comprises a simulation unit for creating a model of a virtual cell from the selected state variables of the virtual data set. The virtual cell simulates a battery cell with the formed virtual data set of state variables.

The management system according to the invention further comprises a data processing unit for calculating a threshold value of a charging current for charging the battery cells in the battery pack from the selected state variables of the virtual data set of the virtual cell. The threshold value of the charging current, thus calculated, can be transmitted to a central control apparatus of the electric vehicle, which central control apparatus can thus limit the charging current in accordance with this threshold value when charging the battery cells in the battery pack.

According to a preferred configuration of the invention, the selection unit selects those state variables from the plurality of data sets of state variables which represent a worst possible state of the virtual cell.

According to an advantageous development of the invention, the management system further comprises an energy prediction unit for predicting an electrical energy which can be stored in the battery cells from the selected state variables of the virtual data set of the virtual cell. The electrical energy, thus predicted, which can be stored in the battery cells can be transmitted to a central control apparatus of the electric vehicle, which central control apparatus can take into account the predicted electrical energy which can be stored in the battery cells when establishing a range of the electric vehicle, for example.

According to a further advantageous development of the invention, the management system further comprises a power prediction unit for predicting a maximum electrical power which can be drawn from the battery cells from the selected state variables of the virtual data set of the virtual cell. The maximum electrical power, thus predicted, which can be drawn from the battery cells can be transmitted to a central control apparatus of the electric vehicle, which central control apparatus can take into account the predicted maximum electrical power which can be drawn from the battery cells, for example, in order to limit a discharge current of the battery pack.

A battery pack is also proposed which comprises a management system according to the invention, a plurality of battery cells, which are connected to one another in series, and at least one recording unit for recording a respective data set of state variables of each battery cell and for transmitting the data set to a selection unit of the management system.

In this case, a separate recording unit can be associated with each battery cell. However, a recording unit can also be provided which records data sets of state variables of a plurality of battery cells.

The method according to the invention is advantageously used in an electric vehicle which comprises at least one battery pack according to the invention. The electric vehicle can be, amongst other things, a purely electrically powered vehicle, a hybrid vehicle as well as a plug-in hybrid vehicle.

The invention makes it possible to calculate or to predict important characteristics for operating the battery cells in the battery pack in a safe and sustainable manner, in a comparatively simple manner, and using comparatively low processing power. Associated with said characteristics are, amongst other things, a threshold value of a charging current for charging the battery cells, a maximum electrical power which can be drawn from the battery cells as well as an electrical energy which can be stored in the battery cells. Said characteristics do not have to be calculated, or predicted, separately for each of the battery cells, and then be linked with one another, but rather each of said characteristics only has to be calculated, or predicted, once. Processing power and memory requirements in the management system are thus advantageously reduced. It is also ensured that said characteristics are always calculated, or predicted, in such a way that it is possible to operate all battery cells in the battery pack in a safe and sustainable manner.

BRIEF DESCRIPTION OF THE DRAWINGS

Embodiments of the invention are explained in greater detail using the drawings and the following description.

In the drawings.

DETAILED DESCRIPTION

In the following description of the embodiments of the invention, identical or similar elements are described using the same reference numbers, wherein a repeated description of these elements is dispensed with in some cases. The figures represent the subject-matter of the invention only schematically.

Figure 1:
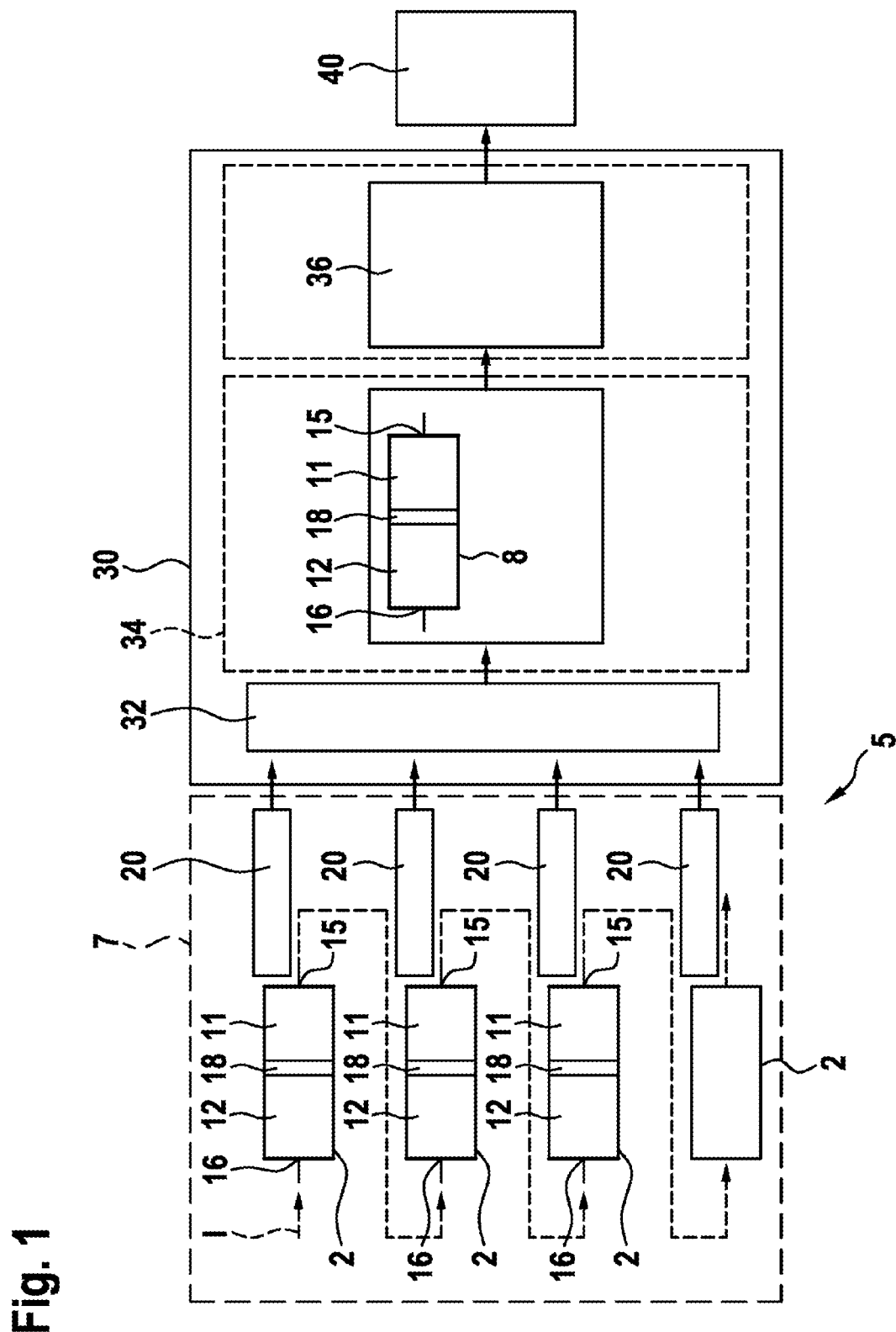
FIG. 1 shows a schematic representation of a battery pack.

FIG. 1 shows a schematic representation of a battery pack 5, which is provided in particular to be used in an electric vehicle. The battery pack 5 comprises a management system 30 which in the present case has a selection unit 32, a simulation unit 34, and a data processing unit 36.

The battery pack 5 further comprises a plurality of battery cells 2 which are electrically connected to one another in series. Each battery cell 2 comprises an electrode unit which in each case has an anode 11 and a cathode 12.

The anode 11 of the electrode unit is connected to a negative current collector 15 of the battery cell 2. The cathode 12 of the electrode unit is connected to a positive current collector 16 of the battery cell 2. A separator 18 is arranged between the anode 11 and the cathode 12. In order to serially connect the battery cells 2 in the battery pack 5, the negative current collector 15 of a battery cell 2 is in each case electrically connected to the positive current collector 16 of the adjacent battery cell 2.

In the representation shown here, a charging current I flows through the battery cells 2 in the battery pack 5. Owing to the electrical serial connection of the battery cells 2, the same charging current I flows through each of the battery cells 2.

In the present case, the battery pack 5 also comprises a plurality of recording units 20. In this case, a recording unit 20 is associated with each battery cell 2. Each of the recording units 20 records a respective data set of state variables from the associated battery cell 2. Alternatively, a recording unit 20 can also be provided which records data sets of state variables of a plurality of battery cells 2 or of all battery cells 2.

The battery cells 2 and the recording units 20 associated with the battery cells 2 form a battery unit 7. The battery pack 5 thus comprises the management system 30 and the battery unit 7.

In the present case, each data set of state variables of one of the battery cells 2 comprises a voltage of the battery cell 2 which is located between the positive current collector 16 and the negative current collector 15. Each data set of state variables further comprises a temperature of the battery cell 2, an overpotential at the anode 11, an overpotential at the cathode 12, a charge state at the anode 11 and a charge state at the cathode 12. The data set can also comprise even more state variables.

The recorded data sets of state variables of the battery cells 2 are transmitted to the selection unit 32 of the management system 30 by the recording units 20. A data set for each battery cell 2 in the battery pack 5 is thus present in the selection unit 32, which data set comprises the above-described state variables.

The recording units 20 can be arranged close to the battery cells 2 and can be connected to the management system 30. However, the recording units 20 can also be incorporated into the management system 30 and can be connected to corresponding sensors for measuring different variables of the battery cells 2.

The selection unit 32 of the management system 30 selects individual state variables from the data sets of state variables of the battery cells 2. The selected state variables then form a virtual data set of state variables. This virtual data set also comprises the above-described state variables. The selected state variables of the virtual data set can all come from one single battery cell 2. However, the selected state variables of the virtual data set usually come from the data sets of state variables of different battery cells 2.

The selection unit 32 selects those state variables from the plurality of data sets of state variables of the battery cells 2 which in each case represent a worst possible state. For example, the highest voltage of the battery cells 2, the highest temperature of the battery cells 2, the lowest overpotential at the anode 11 of the battery cells 2, the highest overpotential at the cathode 12 of the battery cells 2, the highest charge state at the anode 11 of the battery cells 2 and the lowest charge state at the cathode 12 of the battery cells 2 are selected from all data sets.

The simulation unit 34 of the management system 30 creates a model of a virtual cell 8 from the selected state variables of the virtual data set. The virtual cell 8 simulates a battery cell 2 with the virtual data set of state variables created previously. The virtual cell 8 thus has those state variables which in each case represent the worst possible state.

A data processing unit 36 of the management system 30 calculates a threshold value of a charging current I for charging the battery cells 2 in the battery pack 5 from the selected state variables of the virtual cell 8. The threshold value of the charging current I, thus calculated, is transmitted to a central control apparatus 40 of the electric vehicle. The central control apparatus 40 can thus limit the charging current I in accordance with this threshold value when charging the battery cells 2 in the battery pack 5.

Figure 2:
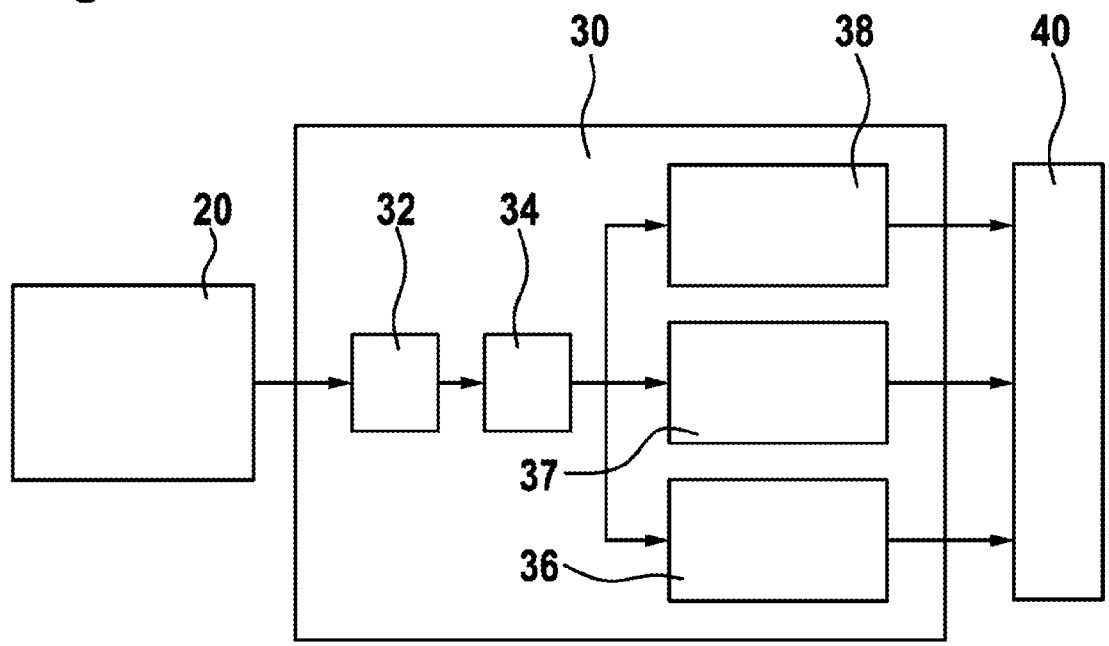
FIG. 2 shows a schematic representation of a management system of a battery pack 5.

FIG. 2 shows a schematic representation of a management system 30 of the battery pack 5. Deviating from the management system 30 which is shown in FIG. 1, the management system 30 represented in FIG. 2 additionally has an energy prediction unit 37 and a power prediction unit 38. The selection unit 32, the simulation unit 34 and the data processing unit 36 remain unchanged. In the present case, the selection unit 32 is only connected to one single recording unit 20 which records and transmits the data sets of state variables of all battery cells 2.

The energy prediction unit 37 additionally predicts an electrical energy which can be stored in the battery cells 2 in the battery pack 5 from the selected state variables of the virtual cell 8. The electrical energy, thus predicted, which can be stored in the battery cells 2 is also transmitted to the central control apparatus 40 of the electric vehicle. The central control apparatus 40 can thus take into account the predicted electrical energy which can be stored in the battery cells 2 when establishing a range of the electric vehicle.

The power prediction unit 38 additionally predicts a maximum electrical power which can be drawn from the battery cells 2 in the battery pack 5 from the selected state variables of the virtual cell 8. The maximum electrical power, thus predicted, which can be drawn from the battery cells 2 is also transmitted to the central control apparatus 40 of the electric vehicle. The central control apparatus 40 can thus take into account the predicted maximum electrical power which can be drawn from the battery cells 2, in order to limit, for example, a discharge current of the battery pack 5, for example when accelerating the electric vehicle.

Figure 3:
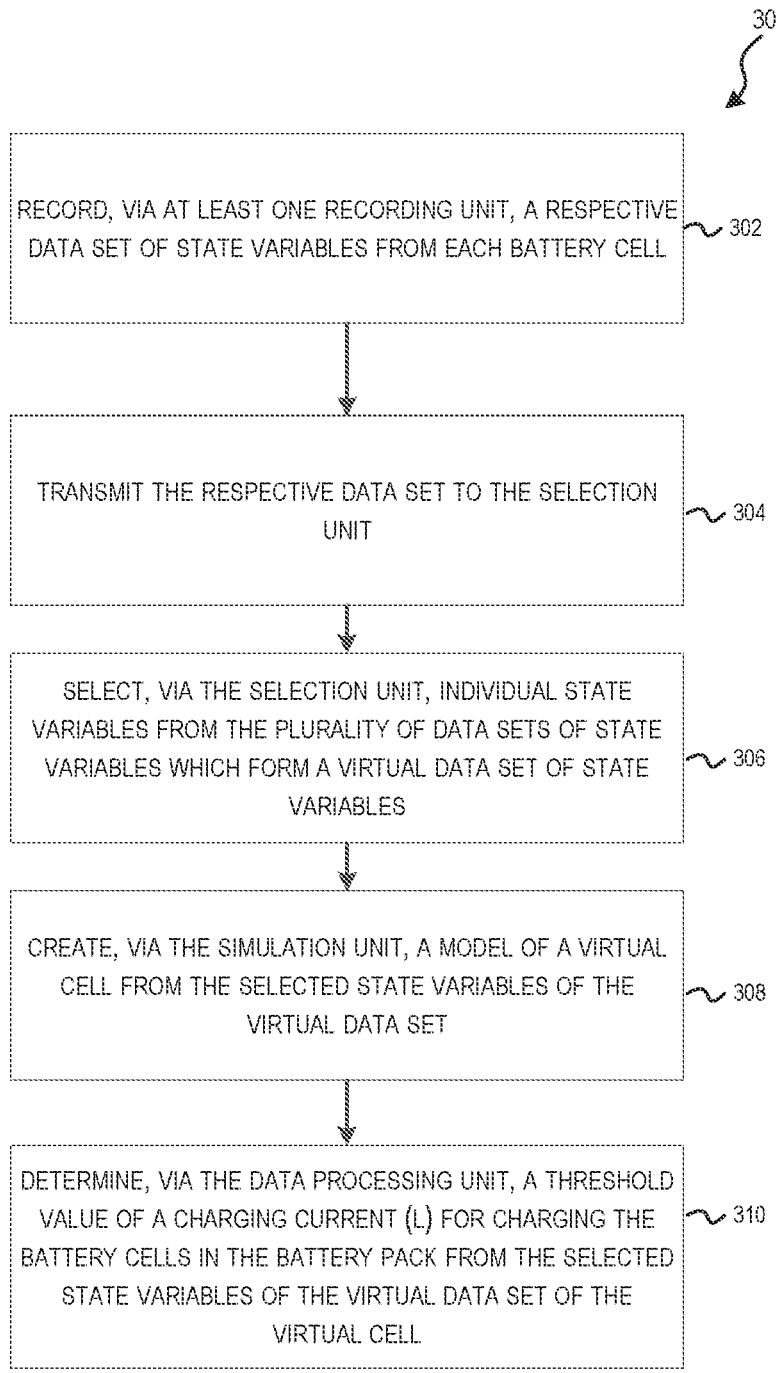
FIG. 3 shows a flowchart of a method for controlling and monitoring a plurality of battery cells in a battery pack.

FIG. 3 shows a flowchart of a method 300 for controlling and monitoring the plurality of battery cells 2 in the battery pack 5. The method 300 includes recording, via at least one recording unit 20, a respective data set of state variables from each battery cell 2 (block 302) and transmitting the respective data set to the selection unit 32 (block 304). The method 300 further includes selecting, via the selection unit 32, individual state variables from the plurality of data sets of state variables which form a virtual data set of state variables (block 306) and creating, via the simulation unit 34, a model of a virtual cell 8 from the selected state variables of the virtual data set (block 308). The method includes, at block 310, determining, via the data processing unit 36, a threshold value of a charging current (I) for charging the battery cells 2 in the battery pack 5 from the selected state variables of the virtual data set of the virtual cell 8.

The invention is not limited to the exemplary embodiments described herein and the aspects highlighted therein. In fact, a large number of variations which are within the scope of the activities of the person skilled in the art are possible within the field specified by the claims.

The invention claimed is:

1. A method for controlling and monitoring a plurality of battery cells (2) in a battery pack (5), the method comprising:
    recording, via at least one recording unit (20), a respective data set of state variables from each battery cell (2);
    transmitting the respective data set to a selection unit (32);
    selecting, via the selection unit (32), individual state variables from the plurality of data sets of state variables which form a virtual data set of state variables;
    creating, via a simulation unit (34), a model of a virtual cell (8) from the selected state variables of the virtual data set; and
    determining, via a data processing unit (36), a threshold value of a charging current (I) for charging the battery cells (2) in the battery pack (5) from the selected state variables of the virtual data set of the virtual cell (8) wherein a power prediction unit (38) predicts a maximum electrical power which can be drawn from the battery cells (2) from the selected state variables of the virtual data set of the virtual cell (8).

2. The method as claimed in claim 1, wherein
the selection unit (32) selects those state variables from the plurality of data sets of state variables which represent a worst possible state of the virtual cell (8).

3. The method as claimed in claim 1, wherein
an energy prediction unit (37) predicts an electrical energy which can be stored in the battery cells (2) from the selected state variables of the virtual data set of the virtual cell (8).

4. The method as claimed in claim 1, wherein
each data set of state variables of a battery cell (2) comprises at least
one voltage of the battery cell (2),
one temperature of the battery cell (2),
one overpotential at an anode (11) of the battery cell (2),
one overpotential at a cathode (12) of the battery cell (2),
one charge state at the anode (11) of the battery cell (2) and
one charge state at the cathode (12) of the battery cell (2).

5. The method as claimed in claim 1, wherein
the virtual data set of state variables of the virtual cell (8) comprises at least
one voltage of the battery cell (2),
one temperature of the battery cell (2),
one overpotential at an anode (11) of the battery cell (2),
one overpotential at a cathode (12) of the battery cell (2),
one charge state at the anode (11) of the battery cell (2) and
one charge state at the cathode (12) of the battery cell (2).

6. A management system (30) for controlling and monitoring a plurality of battery cells (2) in a battery pack (5), the management system comprising:
    a selection unit (32) for selecting individual state variables from a plurality of data sets of state variables, which are transmitted to the selection unit (32), wherein
    the selected state variables form a virtual data set of state variables;
    a simulation unit (34) for creating a model of a virtual cell (8) from the selected state variables of the virtual data set; and
    a data processing unit (36) for calculating a threshold value of a charging current (I) for charging the battery cells (2) in the battery pack (5) from the selected state variables of the virtual data set of the virtual cell (8) wherein a power prediction unit (38) predicts a maximum electrical power which can be drawn from the battery cells (2) from the selected state variables of the virtual data set of the virtual cell (8).

7. The management system (30) as claimed in claim 6, wherein
the selection unit (32) selects those state variables from the plurality of data sets of state variables which represent a worst possible state of the virtual cell (8).

8. The management system (30) as claimed in claim 6, further comprising an energy prediction unit (37) for predicting an electrical energy which can be stored in the battery cells (2) from the selected state variables of the virtual data set of the virtual cell (8).

9. The management system (30) as claimed in claim 6, further comprising a power prediction unit (38) for predicting a maximum electrical power which can be drawn from the battery cells (2) from the selected state variables of the virtual data set of the virtual cell (8).

10. A battery pack (5), comprising
a management system (30) including
  a selection unit (32) for selecting individual state variables from a plurality of data sets of state variables, which are transmitted to the selection unit (32), wherein the selected state variables form a virtual data set of state variables;
  a simulation unit (34) for creating a model of a virtual cell (8) from the selected state variables of the virtual data set; and
  a data processing unit (36) for calculating a threshold value of a charging current (I) for charging the battery cells (2) in the battery pack (5) from the selected state variables of the virtual data set of the virtual cell (8),
a plurality of battery cells (2) which are connected to one another in series, and
at least one recording unit (20) for recording a respective data set of state variables of each battery cell (2) and for transmitting the data set to a selection unit (32) of the management system (30) wherein a power prediction unit (38) predicts a maximum electrical power which can be drawn from the battery cells (2) from the selected state variables of the virtual data set of the virtual cell (8).

11. The battery pack (5) of claim 10, wherein the battery pack is part of an electric vehicle.

\* \* \* \* \*